United States Patent
Pawlikiewicz et al.

(10) Patent No.: US 8,115,281 B2
(45) Date of Patent: Feb. 14, 2012

(54) DIFFERENTIAL VARACTOR

(75) Inventors: Adam H. Pawlikiewicz, Colorado Springs, CO (US); Samir el Rai, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 804 days.

(21) Appl. No.: 12/124,073

(22) Filed: May 20, 2008

(65) Prior Publication Data

US 2009/0289329 A1 Nov. 26, 2009

(51) Int. Cl.
*H01L 29/93* (2006.01)

(52) U.S. Cl. ........... 257/595; 257/602; 257/E21.364; 257/E27.049; 257/E29.344

(58) Field of Classification Search .......... 257/797, 257/E21.525, E23.179, 595–602, E21.364, 257/E27.049, E29.344; 438/401
See application file for complete search history.

(56) References Cited

U.S. PATENT DOCUMENTS

| | | | | |
|---|---|---|---|---|
| 3,535,600 A * | 10/1970 | Engeler | ......... | 257/312 |
| 4,456,917 A * | 6/1984 | Sato et al. | ......... | 257/598 |
| 4,827,319 A * | 5/1989 | Pavlidis et al. | ......... | 257/480 |
| 5,220,194 A * | 6/1993 | Golio et al. | ......... | 257/601 |
| 6,278,158 B1 * | 8/2001 | Pastor et al. | ......... | 257/347 |
| 6,486,744 B1 * | 11/2002 | Cann | ......... | 331/117 D |
| 6,825,089 B1 * | 11/2004 | Shapira et al. | ......... | 438/379 |
| 6,847,905 B2 | 1/2005 | Etheridge et al. | | |
| 6,855,995 B2 | 2/2005 | Altmann | | |
| 6,921,936 B2 | 7/2005 | Kudo | | |
| 6,943,399 B1 | 9/2005 | Gau | | |
| 7,078,787 B1 | 7/2006 | Bulucea | | |
| 7,081,663 B2 | 7/2006 | Bulucea | | |
| 7,223,667 B2 | 5/2007 | Tseng | | |
| 7,235,862 B2 | 6/2007 | Bulucea | | |
| 2005/0067674 A1 * | 3/2005 | Maget | ......... | 257/595 |
| 2006/0169788 A1 * | 8/2006 | Empedocles et al. | ......... | 235/492 |
| 2006/0192268 A1 * | 8/2006 | Benaissa et al. | ......... | 257/595 |
| 2007/0093008 A1 | 4/2007 | Choi | | |

FOREIGN PATENT DOCUMENTS

WO 2007/061308 5/2007

OTHER PUBLICATIONS

Morandini et al., "Differential P+/Nwell varactor High Frequency Characterization", Jun. 2007, IEEE International Conference on Microelectronics Test Structures, pp. 187-191.*

* cited by examiner

*Primary Examiner* — Evan Pert
(74) *Attorney, Agent, or Firm* — Fish & Richardson P.C.

(57) ABSTRACT

A high-Q differential varactor includes reduced inner spacing dimensions between differential fingers.

18 Claims, 6 Drawing Sheets

DIFFERENTIAL VARACTOR

TECHNICAL FIELD

The subject matter of this patent application is generally related to varactors.

BACKGROUND

A varactor is a semiconductor diode with properties of a variable capacitor. In particular, a capacitance of the varactor depends on a voltage applied to the varactor. Conventional differential varactors include differential fingers that are connected to opposite terminals for differential inputs (e.g., a direct current (DC) bias). Conventional differential varactors include stripes and contacts in inner spacing between the differential fingers. The stripes and contacts are used in a single-ended varactor to reduce a resistance of the single-ended varactor. In addition, conventional differential varactors include doped regions in the inner spacing between the differential fingers. The doped regions are used as a contact area for a common terminal.

SUMMARY

A high-Q differential varactor includes reduced inner spacing dimensions between differential fingers.

Particular embodiments of the subject matter described in this specification can be implemented to realize one or more of the following advantages: (i) the overall size of the high-Q differential varactor can be reduced; (ii) the effective resistance of the high-Q differential varactor can be reduced; (iii) the Q-factor of the high-Q differential varactor can be increased; and (iv) the tunability of the high-Q differential varactor can be increased.

The details of one or more embodiments of the subject matter described in this specification are set forth in the accompanying drawings and the description below. Other features, aspects, and advantages of the subject matter will become apparent from the description, the drawings, and the claims.

DESCRIPTION OF DRAWINGS

Like reference symbols in the various drawings indicate like elements.

DETAILED DESCRIPTION

Overview

Figure 1A:
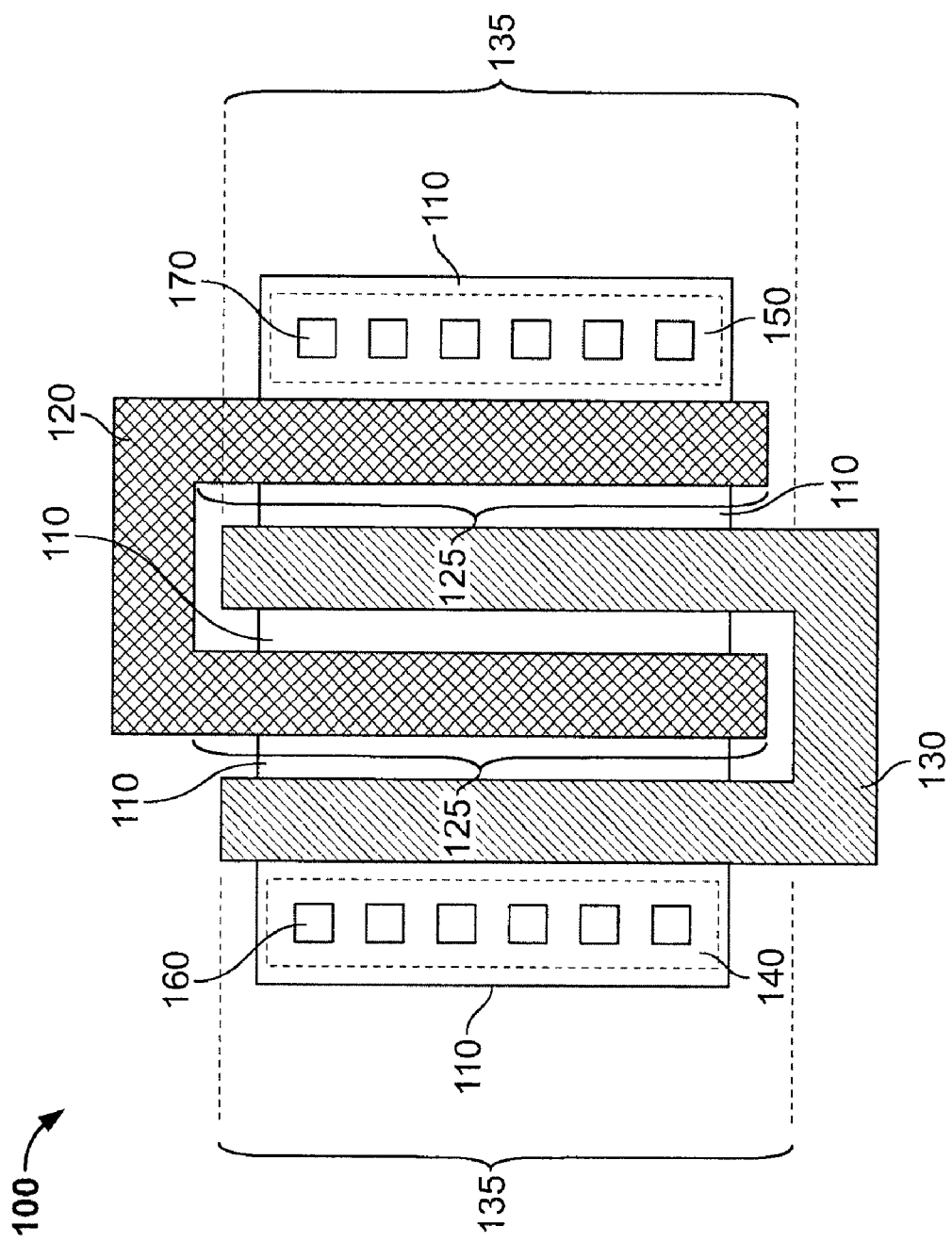
FIG. 1A is a top plan view of an example high-Q differential varactor.

FIG. 1A is a top plan view of an example high-Q differential varactor 100 (e.g., varicap diode, tuning diode). In some implementations, the high-Q differential varactor 100 can have a metal-oxide-semiconductor (MOS) architecture. Alternatively, the high-Q differential varactor can have a complementary-metal-oxide-semiconductor (CMOS) architecture.

The high-Q differential varactor 100 can include insulating material 110, differential gates (e.g., differential gates 120 and 130), stripes (e.g., stripes 140 and 150), and contacts (e.g., sets of contacts 160 and 170).

In some implementations, the insulating material 110 can be a low dielectric constant material. For example, the insulating material 110 can be an oxide insulator (e.g., silicon dioxide). As another example, the insulating material 110 can be silicon oxynitride.

In some implementations, the differential gates can be etched from gate material that is deposited on the insulating material 110. The gate material can be, for example, polycrystalline silicon ("polysilicon") or a metal material (e.g., aluminum). The differential gates include differential fingers (e.g., differential fingers 125 and 135). The differential gates can be coupled to differential terminals.

Stripes and sets of one or more contacts are located at peripheries of the high-Q differential varactor 100. In some implementations, stripes are deposited in a metal layer over the one or more contacts which are formed in another metal layer. The stripes 140 and 150 are visibly represented by the dotted lines in FIG. 1A to indicate that the sets of contacts 160 and 170 are formed underneath a metal layer as represented by the dotted lines.

In particular, stripe 140 is deposited on the set of contacts 160, and stripe 150 is deposited on the set of contacts 170. The stripes 140 and 150 (and the contacts 160 and 170) can be used as a common terminal. The stripes can be formed from low resistance materials. In some implementations, the stripes are metal. The stripes and sets of contacts can be coupled to doped regions, as will be described in further detail below with reference to FIG. 2.

In some implementations, a single contact can be used instead of a set of contacts. For example, if the high-Q differential varactor is small (e.g., on the order of the size of a length of a stripe), a single contact can be used in place of each set of contacts. Alternatively, if the high-Q differential varactor is large (e.g., a stripe that is at least two times longer than a contact), sets of contacts can be used.

Inner spacing between differential finger 125 and differential finger 135 can be insulating material 110. In some implementations, the inner spacing does not include stripes, contacts, or doped regions. Therefore, an inner spacing dimension between the differential fingers (e.g., distance between the differential fingers) can be sized (e.g., reduced).

Figure 1B:
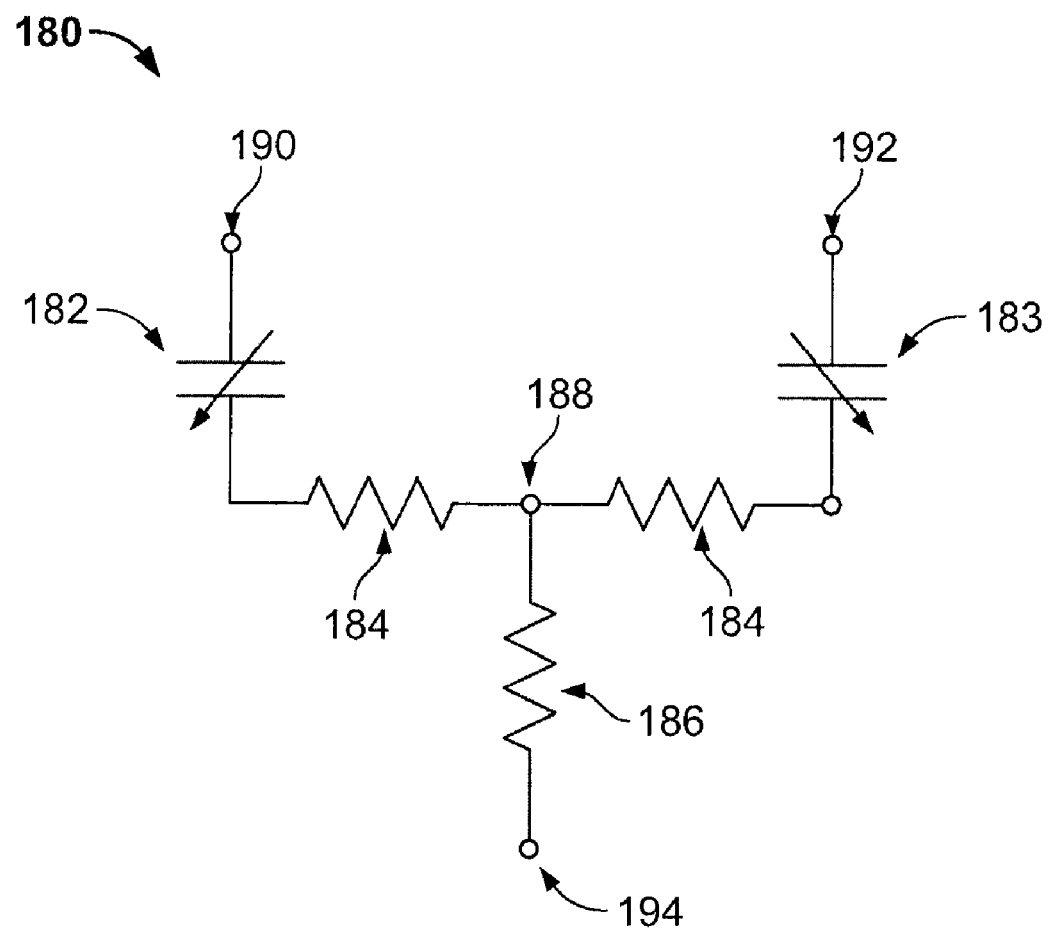
FIG. 1B is a schematic diagram of an equivalent circuit that represents electrical properties of the example high-Q differential varactor of FIG. 1A.

FIG. 1B is a schematic diagram of an equivalent circuit 180 that represents electrical properties of a high-Q differential varactor. The equivalent circuit 180 includes variable capacitors 182 and 183, each coupled in series to resistive elements 184 (e.g., a resistor). The resistive elements 184 represent the resistance between the differential fingers of the high-Q differential varactor. The resistive elements 184 are coupled to another resistive element 186. The resistive element 186 represents, for example, the resistance of the contacts, stripes and lateral conduction to a virtual ground (e.g., a virtual ground at a node 188).

Nodes 190, 192, and 194 represent terminals that correspond to elements in FIG. 1A. In particular, node 190 can represent a terminal that corresponds to differential gate 130, and node 192 can represent a terminal that corresponds to differential gate 120. Node 194 can represent a terminal that corresponds to the stripes 140 or 150. In some implementations, stripes 140 and 150 can be shorted together.

A Q-factor ("Q") represents the effect of electrical resistance on an electrical device. In particular, Q is a ratio of reactance to resistance and can be represented by an equation:

$$Q = \left|\frac{X}{R}\right|, \text{ where}$$

X is the reactance and R is the resistance. Reducing the inner spacing dimension between the differential fingers reduces a resistance of the doped regions. Because the resistance of the doped regions of the high-Q differential varactor (e.g., real impedance value of resistors 184) is reduced, R is reduced. As a result, Q of the high-Q differential varactor is increased. For example, a high-Q differential varactor can have a Q that is at least 5% greater than a Q of a conventional differential varactor. As a further example, if a conventional differential varactor has a Q-factor of 20, then a high-Q differential varactor can have a Q-factor of 21 or greater.

Furthermore, stripes and contacts can create a parasitic capacitance. In some implementations, because the stripes and contacts are not present, the parasitic capacitance of the stripes and contacts can be eliminated. The reduction of the parasitic capacitance increases the tunability of the high-Q differential varactor (e.g., variability of the capacitance of the high-Q differential varactor).

In addition, a depletion region width of the high-Q differential varactor can vary with an applied bias voltage. The depletion region width can be proportional to the applied bias voltage, and capacitance can be inversely proportional to the depletion region width. As the inner spacing dimension is reduced, the depletion region width can also be reduced. Therefore, the capacitance is increased, thereby increasing the tunability of the high-Q differential varactor.

Cross-Sectional View

Figure 2:
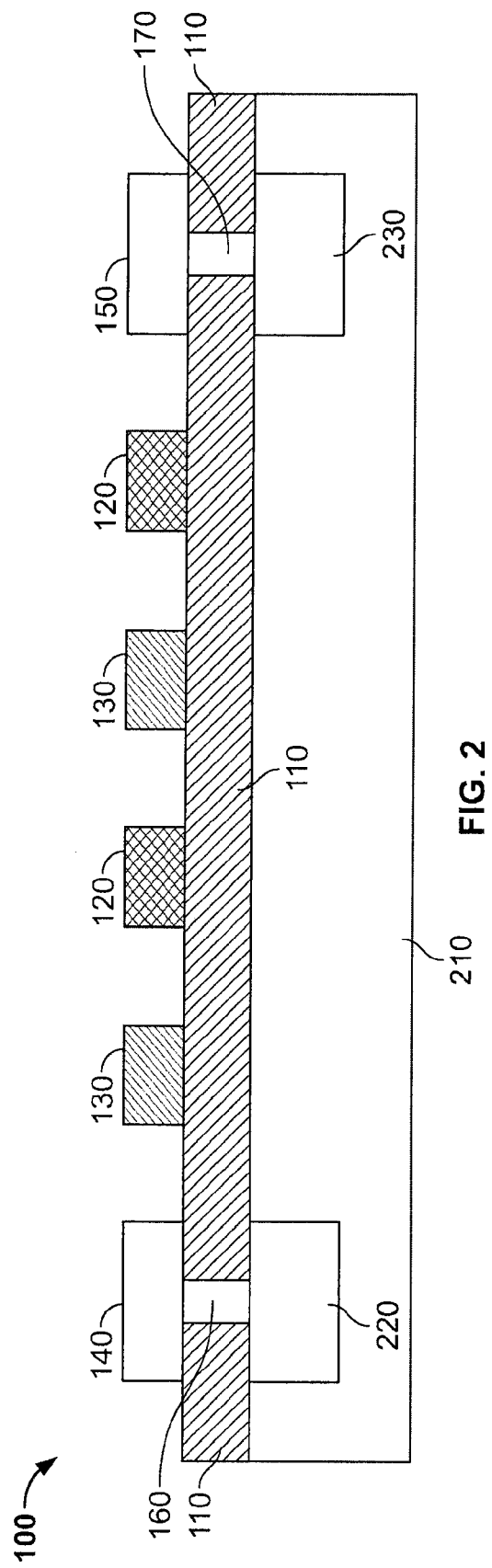
FIG. 2 is a cross-sectional view of the example high-Q differential varactor of FIG. 1A.

FIG. 2 is a cross-sectional view of the example high-Q differential varactor 100 of FIG. 1A.

The high-Q differential varactor can include a substrate 210. The substrate 210 can be, for example, silicon (Si) or a mixture of silicon and germanium (SiGe). In some implementations, the substrate can be n-type (e.g., N-substrate). Alternatively, the substrate can be p-type (e.g., P-substrate).

Doped regions (e.g., doped regions 220 and 230) can be disposed (e.g., diffused or implanted) in the substrate 210. In some implementations, the doped regions can be external to inner spacing in the substrate between the differential gates. The doped regions can be disposed external to the inner spacing between the differential gates, and disposed at opposite peripheries of the differential gates. For example, doped region 220 is disposed external to the inner spacing between the differential gate 120 and the differential gate 130. In particular, doped region 220 is disposed external to the inner spacing between the differential fingers 125 and 135 of the differential gates 120 and 130, respectively. As another example, doped region 230 can be disposed external to the inner spacing between the differential gates 120 and 130. In particular, doped region 220 is disposed external to the inner spacing between the differential fingers 125 and 135.

In some implementations, doped regions can be disposed internal to the inner spacing between the differential fingers. The doped regions can be sized to reduce an inner spacing dimension.

The doped regions can include a same type of doping, and the doping of the doped regions can be different from the substrate 210. In some implementations, the high-Q differential varactor can be a n-channel (e.g., nMOS) varactor. In a n-channel varactor, the doped regions 220 and 230 are n-type. For example, the doped regions 220 and 230 can be n+ regions, where "n" represents the type of doping, and "+" indicates an amount of doping (e.g., highly doped). Alternatively, the high-Q differential varactor can be a p-channel (e.g., PMOS) varactor. In a p-channel varactor, the doped regions 220 and 230 are p-type. For example the doped regions 220 and 230 can be p+ regions, where "p" represents the type of doping, and "+" indicates an amount of doping. The doped regions 220 and 230 can be used as a contact area for a common terminal.

The high-Q differential varactor can further include insulating material 110 deposited on the substrate 210. In some implementations, insulating material can also be deposited around the differential gates. For example, the differential gates can be formed in the insulating material.

The insulating material 110 can be deposited over the doped regions 220 and 230. In particular, doped region 220 can be located below the set of contacts 160 and the insulating material 110. Doped region 230 can be located below the set of contacts 170 and the insulating material 110.

The sets of contacts 160 and 170 can be coupled to the doped regions 220 and 230, respectively. The stripes 140 and 150 can be deposited over the sets of contacts 160 and 170, respectively. In some implementations, the sets of one or more contacts can be external to the inner spacing between the differential fingers. In some implementations, the sets of one or more contacts can be external to the inner spacing in the insulating material between the differential fingers.

Disposing components (e.g., contacts, doped regions, and stripes) external to the inner spacing allows the inner spacing dimension to be reduced. In addition, sizing doped regions internal to the inner spacing allows the inner spacing dimension to be reduced. In particular, the inner spacing dimension can be reduced to less than or equal to about 0.28 micrometers. For example, for a 0.18 micrometer technology, the inner spacing dimension can be 0.28 micrometers. As another example, for higher nodes (e.g., 0.13 micrometer, 90 nanometer, 45 nanometer technologies), the inner spacing dimension can be less than 0.13 micrometers.

Sizing Inner Spacing

Figure 3:
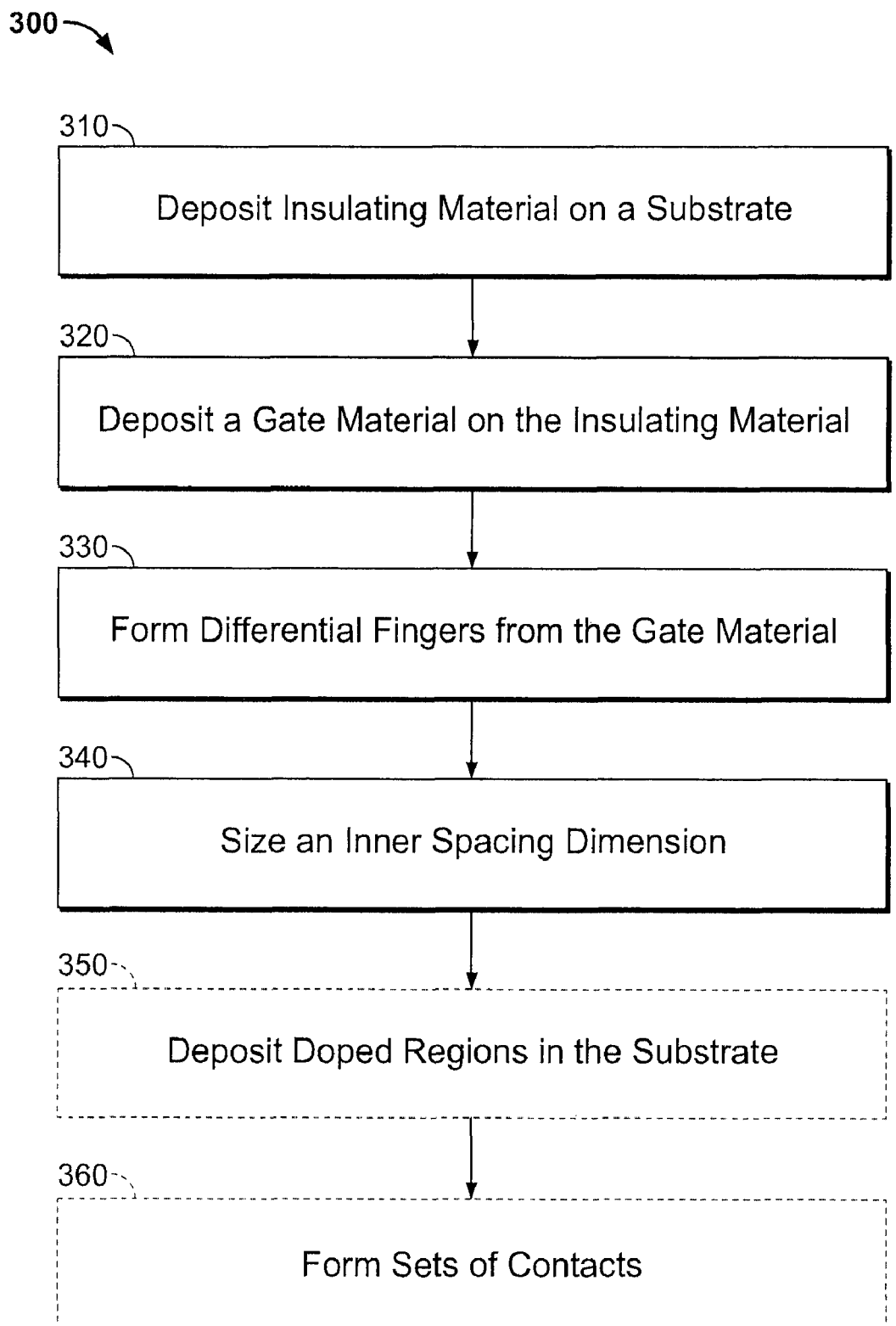
FIG. 3 is a flow diagram of an example method to fabricate the high Q differential varactor of FIG. 1A.

FIG. 3 is a flow diagram of an example method 300 to fabricate the high-Q differential varactor of FIG. 1A.

The method 300 starts by depositing insulating material on a substrate (310). Gate material is deposited on the insulating material to form a layer (320). Differential fingers are formed from the gate material, where inner spacing in the layer between the differential fingers is insulating material (330).

An inner spacing dimension can be sized to reduce a resistance of doped regions and increase a Q-factor of the differential varactor (340). In particular, doped regions are deposited in the substrate (350). The doped regions can be disposed external to the inner spacing between the differential fingers. Furthermore, the doped regions can be disposed at opposite peripheries of the differential fingers. For example, a first doped region (e.g., doped region 220) can be deposited at one periphery of a first differential gate (e.g., differential gate 130). As another example, a second doped region (e.g., doped region 230) can be deposited at an opposite periphery (e.g., at a second periphery of differential gate 120).

In some implementations, sets of one or more contacts can be formed that are coupled to the doped region (360). For example, a first set of contacts (e.g., set of contacts 160) can be formed so that they are coupled to the first doped region. As another example, a second set of contacts (e.g., set of contacts 170) can be formed so that they are coupled to the second doped region.

Alternative Implementations

Figure 4:
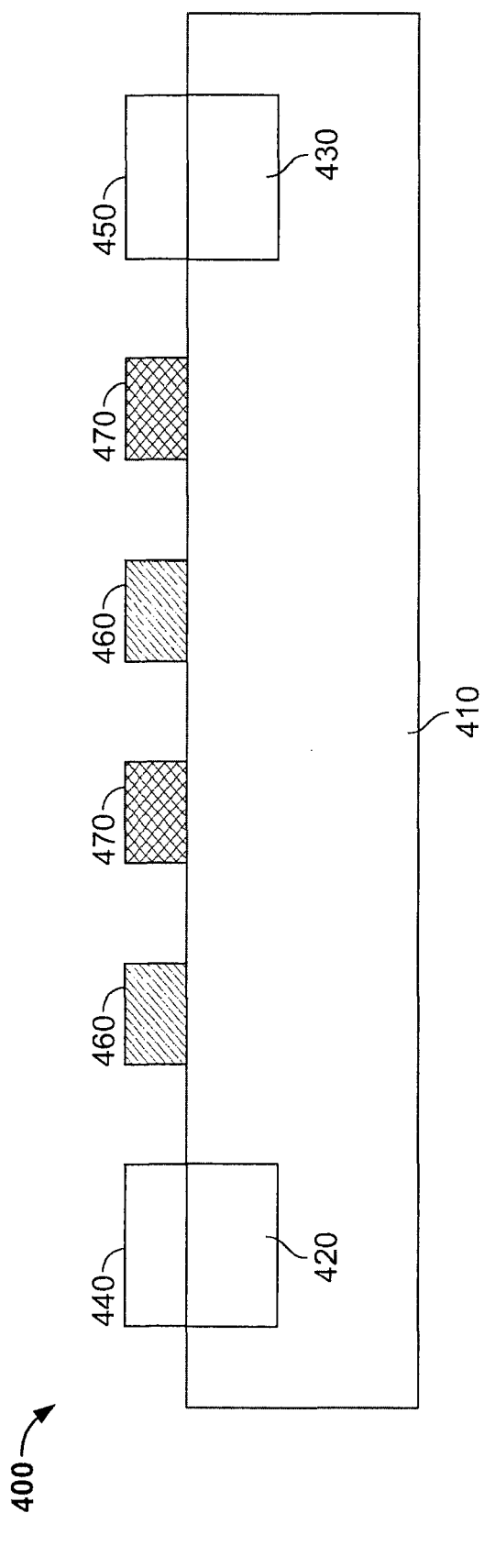
FIG. 4 is a cross-sectional view of another example high-Q differential varactor.

FIG. 4 is a cross-sectional view of another example high-Q differential varactor 400. The high-Q differential varactor 400 can include a substrate 410. Doped regions 420 and 430 can be disposed in the substrate 410. Stripes 440 and 450 can be deposited over the doped regions 420 and 430. For example, the substrate 410 can be a mixture of gallium and arsenide (GaAs), and the stripes 440 and 450 can be deposited in a metal layer over the doped regions 420 and 430.

Gate material can be deposited on the substrate 410 (e.g., metal stripes on III-V or II-VI compound semiconductor material), and differential gates 460 and 470 are formed from the gate material. Inner spacing between the differential gates 460 and 470 is the substrate 410, and an inner spacing dimension can be sized to reduce a resistance of the doped regions 420 and 430 in the substrate 410 and to increase a Q-factor of the differential varactor 400. In particular, the inner spacing dimension can be reduced to less than or equal to about 0.28 micrometers.

Figure 5:
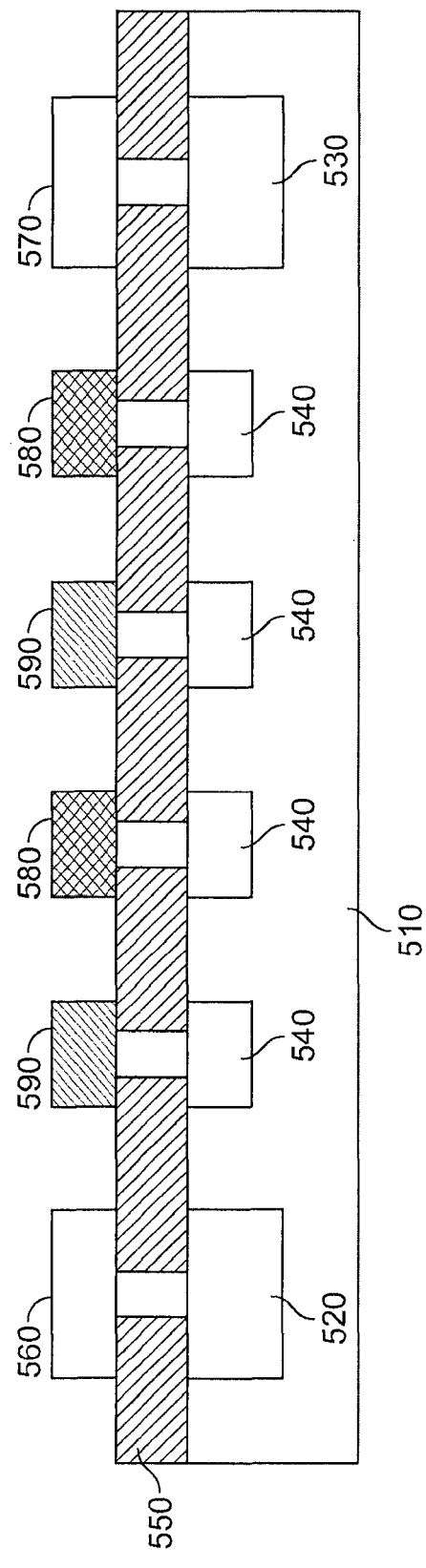
FIG. 5 is a cross-sectional view of yet another example high-Q differential varactor.

FIG. 5 is a cross-sectional view of yet another example high-Q differential varactor 500. In some implementations, the high-Q differential varactor 500 can have a p-n junction or a n-p junction architecture. The high-Q differential varactor 500 can include a substrate 510 (e.g., Si, SiGe, or III-V compound semiconductor materials). Doped regions 520 and 530 can be disposed in the substrate 510. The doped regions 520 and 530 can be the same polarity as the substrate, in order to provide good ohmic contact. For example if the substrate is p-type, the doped regions 520 and 530 can be p+ regions. As another example, if the substrate is n-type, the doped regions 520 and 530 can be n+ regions.

Doped regions 540 can also be disposed in the substrate 510. The doped regions 540 can be of the opposite specie and polarity from the substrate 510 to form p-n or n-p junctions. Insulating material 550 can be deposited over the doped regions 520, 530, and 540. Stripes 560 and 570 can be deposited in a layer over the doped regions 520 and 530 that is of the same doping as the doped regions 520 and 530. For example, if the doped regions 520 and 530 are n-type, then the stripes 560 and 570 are deposited in a n-type layer. As another example, if the doped regions 520 and 530 are p-type, then the stripes 540 and 550 are deposited in a p-type layer.

Differential fingers 580 and 590 can be deposited in a layer over the doped regions 540. The differential fingers can be formed from materials such as, for example, polysilicon or metal. Inner spacing between the differential fingers 580 and 590 is the insulating material 550, and an inner spacing dimension can be sized to reduce a resistance of the doped regions 520 and 530 in the substrate 510 and to increase a Q-factor of the differential varactor 500. In particular, the inner spacing dimension can be reduced to less than or equal to about 0.28 micrometers.

Applications

A disadvantage of using conventional varactors in an electronic oscillator is that conventional varactors can have a low Q. High-Q differential varactors have, however, an increased Q and an increased tunability. Therefore, one or more high-Q differential varactors can be used in electronic oscillators.

Figure 6:
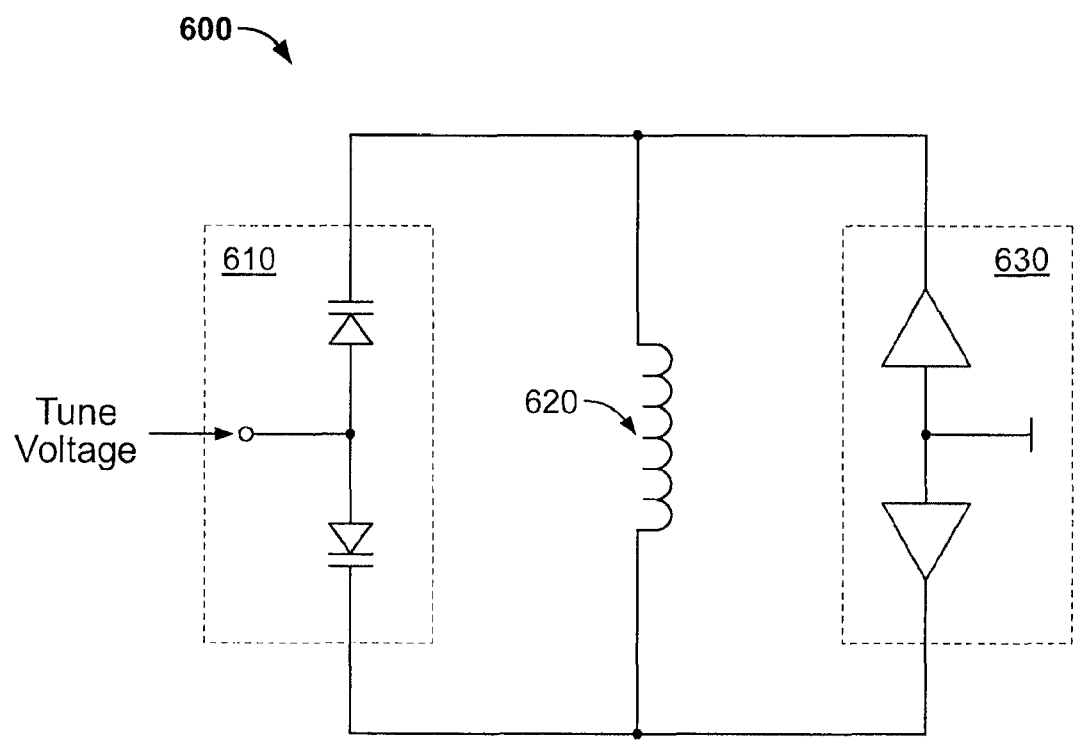
FIG. 6 is a schematic diagram of an example electronic oscillator including a high-Q differential varactor.

FIG. 6 is a schematic diagram of an example electronic oscillator 600 including a high-Q differential varactor 610. The electronic oscillator includes a differential varactor 610 (e.g., a high-Q differential varactor), an inductor 620, and an amplifier 630. The differential varactor 610 can be coupled in parallel to the inductor 620 and the amplifier 630. The differential varactor 610 can be used as a voltage-controlled capacitor to vary the frequency output of the oscillator 600.

In some implementations, the electronic oscillator can be a voltage-controlled oscillator (VCO). In some implementations, the electronic oscillator can be a variable frequency oscillator (VFO). The increased Q of the high-Q differential varactors allows the high-Q differential varactors to be used in VCOs and VFOs. In particular, the increased variability of the capacitance of the high-Q differential varactor allows more precise tuning (e.g., finer adjustments over a small range of oscillation frequencies).

For example, high-Q differential varactors can be used in VCOs in function generators, production of electronic music, phase-locked loops, and frequency synthesizers. As another example, high-Q differential varactors can be used in analog VFOs in radio receivers and transmitters.

Alternatively, one or more high-Q differential varactors can be used in an electronic amplifier. For example, high-Q differential varactors can be used in parametric amplifiers in audio receivers. In particular, voltage amplification can be obtained by varying the amount of capacitance in a circuit. The increased variability of the capacitance of the high-Q differential varactor allows more precise amplification at lower noise levels than resistive circuits.

A number of implementations of the invention have been described. Nevertheless, it will be understood that various modifications may be made without departing from the spirit and scope of the invention. Accordingly, other implementations are within the scope of the following claims.

What is claimed is:

1. A differential varactor comprising:
   a substrate;
   insulating material deposited on the substrate; and
   differential fingers formed on the insulating material, where inner spacing between the differential fingers lacks contacts and stripes, and an inner spacing dimension is reduced in comparison to another inner spacing dimension sized to include contacts and stripes, and the inner spacing dimension is sized to reduce a resistance of a plurality of doped regions in the substrate and to increase a Q-factor of the differential varactor.

2. The differential varactor of claim 1, further comprising:
   a first doped region and a second doped region in the substrate, the plurality of doped regions being disposed external to the inner spacing between the differential fingers, and the first doped region and the second doped region disposed at opposite peripheries of the differential fingers;
   one or more contacts coupled to the first doped region; and
   one or more contacts coupled to the second doped region.

3. The differential varactor of claim 2, where the one or more contacts are external to the inner spacing between the differential fingers.

4. The differential varactor of claim 2, where the one or more contacts are external to the inner spacing in the insulating material between the differential fingers.

5. The differential varactor of claim 2, where the plurality of doped regions are external to the inner spacing in the substrate between the differential fingers.

6. The differential varactor of claim 2, where the plurality of doped regions are disposed internal to the inner spacing between the differential fingers, and the plurality of doped regions are sized to reduce the inner spacing dimension.

7. The differential varactor of claim 1, where the inner spacing dimension is less than or equal to about 0.28 micrometers.

8. The differential varactor of claim 1, where insulating material is deposited around the differential fingers.

9. The differential varactor of claim 1, where the the differential fingers are formed in the insulating material.

10. A system comprising:
an electronic oscillator that includes one or more differential varactors, the one or more differential varactors including:
differential fingers formed on insulating material deposited on a substrate, where the inner spacing between the differential fingers lacks contacts and stripes.

11. The system of claim 10, where one or more contacts are external to the inner spacing between the differential fingers.

12. The system of claim 10, where one or more contacts are external to the inner spacing in the insulating material between the differential fingers.

13. The system of claim 10, where a plurality of doped regions are external to the inner spacing in the substrate between the differential fingers.

14. The system of claim 10, where a plurality of doped regions are disposed internal to the inner spacing between the differential fingers, and the plurality of doped regions are sized to reduce an inner spacing dimension.

15. The system of claim 10, where an inner spacing dimension is less than or equal to about 0.28 micrometers.

16. The system of claim 10, where the electronic oscillator is a voltage-controlled oscillator (VCO) or a variable frequency oscillator (VFO).

17. A system comprising:
an electronic amplifier that includes one or more differential varactors, the one or more differential varactors including:
differential fingers formed on insulating material deposited on a substrate, where the inner spacing between the differential fingers lacks contacts and stripes.

18. The system of claim 17, where an inner spacing dimension is less than or equal to about 0.28 micrometers.

* * * * *

UNITED STATES PATENT AND TRADEMARK OFFICE
CERTIFICATE OF CORRECTION

PATENT NO.         : 8,115,281 B2
APPLICATION NO.    : 12/124073
DATED              : February 14, 2012
INVENTOR(S)        : Adam H. Pawlikiewicz and Samir el Rai Page 1 of 1

It is certified that error appears in the above-identified patent and that said Letters Patent is hereby corrected as shown below:

Column 1, line 52, delete "high Q" and insert -- high-Q --

Column 4, line 10, delete "PMOS)" and insert -- pMOS) --

Column 7, line 10, within claim 9 after "where" delete "the"

Signed and Sealed this
Twenty-ninth Day of May, 2012

David J. Kappos
*Director of the United States Patent and Trademark Office*